(12) United States Patent
Park et al.

(10) Patent No.: US 6,511,919 B1
(45) Date of Patent: Jan. 28, 2003

(54) CONTACTS FOR A BIT LINE AND A STORAGE NODE IN A SEMICONDUCTOR DEVICE

(75) Inventors: Young-Woo Park, Kunpo-shi (KR); Won-Sung Lee, Seoul (KR)

(73) Assignee: Samsung Electronics Co., Ltd., Hwasung (KR)

( * ) Notice: Subject to any disclaimer, the term of this patent is extended or adjusted under 35 U.S.C. 154(b) by 26 days.

(21) Appl. No.: 09/649,386

(22) Filed: Aug. 28, 2000

(30) Foreign Application Priority Data

Aug. 26, 1999 (KR) ............................................. 99-35700

(51) Int. Cl.⁷ ........................................... H01L 21/461
(52) U.S. Cl. ........................ 438/723; 438/724; 438/675
(58) Field of Search ................................. 438/637–639, 438/700, 672–675, 723

(56) References Cited

U.S. PATENT DOCUMENTS 6,255,224 B1 * 7/2001 Kim ........................... 438/723
6,337,275 B1 * 1/2002 Cho et al. ................... 438/675

* cited by examiner

Primary Examiner—David Nelms
Assistant Examiner—Dung A Le
(74) Attorney, Agent, or Firm—Marger Johnson & McCollom, P.C.

(57) ABSTRACT

A method of forming self-aligned contact holes in an oxide layer to expose a semiconductor substrate between adjacent gate lines. The gate lines are formed such that a spacing between adjacent gate lines in the storage node contact region is equal to or greater than a spacing between adjacent gate lines in the bit line contact region. An insulating layer is deposited on the gate line to fill spaces between the gate lines. Self-aligned contact holes are formed in the insulating layer, using a photolithographic process. As a result, storage node contact hole not-opening phenomenon and bit line contact shoulder over-etching phenomenon can be avoided.

16 Claims, 5 Drawing Sheets

CONTACTS FOR A BIT LINE AND A STORAGE NODE IN A SEMICONDUCTOR DEVICE

BACKGROUND OF THE INVENTION

1. Field of the Invention

The present invention relates to a method for fabricating semiconductor devices and, more particularly, to a method of forming contacts between adjacent gate lines.

2. Description of the Related Art

In conventional DRAM devices having numerous memory cells, one memory cell stores one bit of information. A memory cell typically consists of a storage capacitor and an access transistor. Either one of source or drain impurity regions of the access transistor is connected to one of the capacitor terminals. The other impurity region and the transistor gate electrode are connected to a bit line and a word line, respectively. In addition, the other capacitor terminal is connected to a reference voltage. It is, therefore, important to provide a proper electrical connection between components of the devices for operation. Such connections between device components can be made by contacts formed in the insulating layer.

With recent advances of semiconductor manufacturing techniques, design rules get smaller and smaller for semiconductor devices. As a result, alignment margin is difficult to secure, especially when aligning contacts between closely spaced conductive lines. Accordingly, for sub-quarter micron semiconductor devices, contacts are formed self-aligned with conductive lines.

The well-known self-aligned contact (SAC) formation process is described as follows. First, gate lines are formed on a semiconductor substrate. Nitride spacers are formed on the sidewalls of the gate lines. An interlayer insulating layer is deposited on the substrate including the gate lines and the spacers. Selected portions of the interlayer insulating layer are etched to form self-aligned contact holes for bit lines and capacitor storage nodes. FIG. 1A schematically shows the resulting structure formed in accordance with above-mentioned conventional method, i.e., a top plan view of a semiconductor substrate with a COB (capacitor over bit line) structure. In FIG. 1A, reference number 10 denotes a gate line, reference number 12 denotes a bit line, reference number 14 denotes a storage node contact (hereinafter referred to as BC), reference number 16 denotes a bit line contact (hereinafter referred to as DC), reference number 22 denotes an active region and 24 denotes a nitride spacer. In the COB structure, since bit line 12 intersects gate line 10 outside of the active region 22, DC 16 is formed in the active region and extends out of the active region 22, thus DC 16 is formed larger than BC 14 in a given area. Also, in a CUB (capacitor under bit line) structure, DC is formed larger than BC because larger contact area is preferably needed to reduce sheet resistance, and BC 14 is more restricted against enlargement of its area than DC is. Accordingly, a spacing between adjacent gate lines where the DC hole is to be formed (hereinafter referred to as the DC forming region) is larger than a spacing between adjacent gate lines where the BC hole is to be formed (hereinafter referred to as the BC forming region), and the layout for the plural adjacent gate line is adjusted to meet these conditions.

FIG. 1B, a cross-sectional view taken along line I–I' of FIG. 1A, illustrates a problem associated with above-mentioned gate line layout. When an interlayer insulating layer 26 is etched to form the DC and BC holes, several problems can occur. As described above, according to the conventional method, DC has a larger margin than BC. In addition, DC is formed to a dimension larger than BC. The DC hole etching rate is relatively greater than the BC hole etching rate. As a result, the interlayer insulating layer 26 can remain on the substrate of the BC forming region (see reference number 26a of FIG. 1B, so called "not-opening phenomenon") due to low BC hole etching rate. On the other hand, the nitride spacer 24 can be over-etched (see inside the circle of the reference number 27 of FIG. 2) due to high DC hole etching rate, thereby weakening the top edge portion of the gate lines (weakening the DC shoulder) and, in a severe case, exposing the gate lines. This results in an undesirable electrical bridge between the gate lines and the DC pads.

Accordingly, a method is needed to form SAC openings avoiding the above described not-opening and over-etching problems.

SUMMARY OF THE INVENTION

The present invention provides a method of forming self-aligned contacts between adjacent gate lines for a bit line and a capacitor in a semiconductor device.

According to the present invention, gate lines are formed such that a spacing between adjacent gate lines where a bit line contact hole is to be made is equal to or less than a spacing between adjacent gate lines where a storage node contact is to be made.

According to one embodiment of the present invention, a top dimension of the bit line contact is larger than a top dimension of the storage node contact.

In accordance with another embodiment of the present invention, a method of forming self-aligned contacts between adjacent gate lines in a semiconductor device is provided. The method includes forming a gate electrode layer on a semiconductor substrate. The gate electrode layer is etched to form a plurality of spaced apart gate lines. A spacing between adjacent gate lines where a bit line contact is to be made is equal to or less than a spacing between gates where a storage node contact is to be made. A nitride layer is formed on the semiconductor substrate including the gate lines. The nitride layer is then etched to form a nitride spacer on a sidewall of each of the gate lines. An oxide layer is formed to fill spaces between the gate lines. The oxide layer is etched to form a bit line contact hole and a storage node contact hole. A top dimension of the bit line contact is larger than a top dimension of the storage node contact.

The method may further include forming a second nitride layer after the formation of the nitride spacer.

Preferably, the spacing between adjacent gate lines where a bit line contact is to be made is in the range of about 0.05 to 0.3 microns and the spacing between adjacent gate lines where storage node contact is to be made is in the range of about 0.1 to 0.4 microns.

The top dimension of the storage node contact is in the range of about 0.28 micron×0.5× to 0.28 micron×0.5 to 0.28 micron×1×0.28 micron×1 and the top dimension of the bit line contact is in the range of about 0.28 micron×0.5×0.48 micron×0.5 to 0.28 micron×1×0.48 micron×1.

In accordance with yet another embodiment of the present invention, a method of forming self-aligned contacts between adjacent gate lines in a semiconductor device is provided. The method includes forming a gate electrode layer on a semiconductor substrate. The gate electrode layer is etched to form a plurality of spaced apart gate lines. A spacing between adjacent gate lines where a bit line contact is to be made is equal to or less than a spacing between adjacent gate lines where a storage node contact is to be made. A nitride layer is formed on the semiconductor substrate including the gate lines. An oxide layer is formed on the nitride layer to fill spaces between the gate lines. The oxide layer and the nitride layer are etched to form a bit line contact hole and a storage node contact hole while concurrently forming a nitride sidewall spacer on a sidewall of each of the gate lines. A top dimension of the bit line contact is larger than a top dimension of the storage node contact. Preferably, a spacing between adjacent gate lines where a bit line contact is to be made is in the range of about 0.05 to 0.3 microns and a spacing between adjacent gate lines where a storage node contact is to be made is in the range of about 0.1 to 0.4 microns.

In a preferred embodiment of the present invention, the top dimension of the storage node contact is in the range of about 0.28 micron×0.5×0.28 micron×0.5 to 0.28 micron×1× 0.28 micron×1 and the top dimension of the bit line contact is in the range of about 0.28 micron×0.5×0.48 micron×0.5 to 0.28 micron×1×0.48 micron×1. Here, the dimension is multiplied by a factor of "0.5" to reflect a potential error during photolithography and thereby cover the possible shrinkage of the resulting pattern to about 50%. A multiplication factor of "1" represents the dimension of the pattern without any such shrinkage.

In accordance with another aspect of the present invention, a self-aligned contact between adjacent gate lines are provided. The self-aligned contact includes a plurality of gate lines formed on a semiconductor substrate. An insulating layer is formed on the gate lines. A bit line contact and a storage node contact are formed in the insulating layer to the substrate between the gate lines. A spacing between adjacent gate lines where the bit line contact is formed is equal to or less than a spacing between adjacent gate lines where the storage node is formed. A top dimension of the bit line contact is larger than a top dimension of the storage node contact.

In a preferred embodiment of the present invention, a spacing between adjacent gate lines where a bit line contact is to be made is in the range of about 0.05 to 0.3 microns and a spacing between the gate lines where a storage node contact is to be made is in the range of about 0.1 to 0.4 microns.

BRIEF DESCRIPTION OF THE DRAWINGS

The above features and advantages of the invention will become apparent upon reference to the following detailed description of specific embodiments and the attached drawings, of which.

DETAILED DESCRIPTION OF THE PREFERRED EMBODIMENTS

Figure 1A:
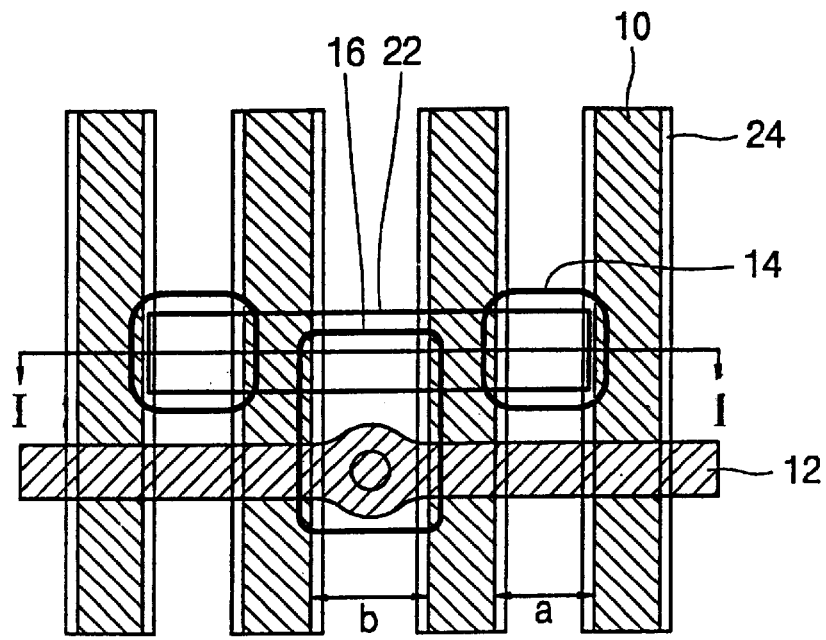
FIG. 1A is a top plan view showing a layout of conventional gate and bit lines.
Figure 1B:
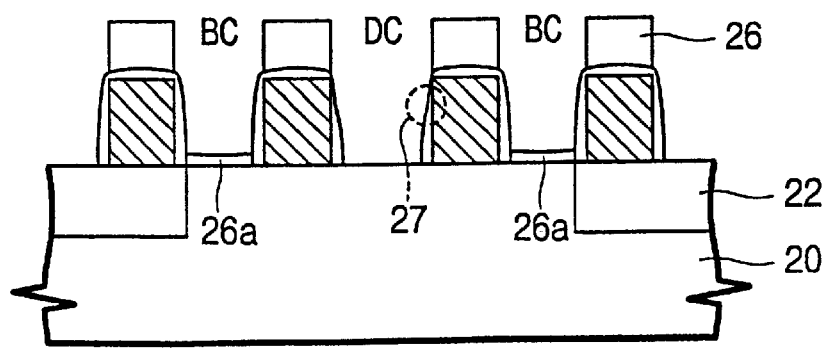
FIG. 1B is a cross-sectional view taken along line I–I' of FIG. 1.

The present invention will now be described more fully hereinafter with reference to the accompanying drawings, in which preferred embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. It will also be understood that when a layer is referred to as being "on" another layer or substrate, it can be directly on the other layer or substrate or intervening layers may also be present. Moreover, each embodiment described and illustrated herein includes its complementary conductivity type embodiment as well.

Figure 2:
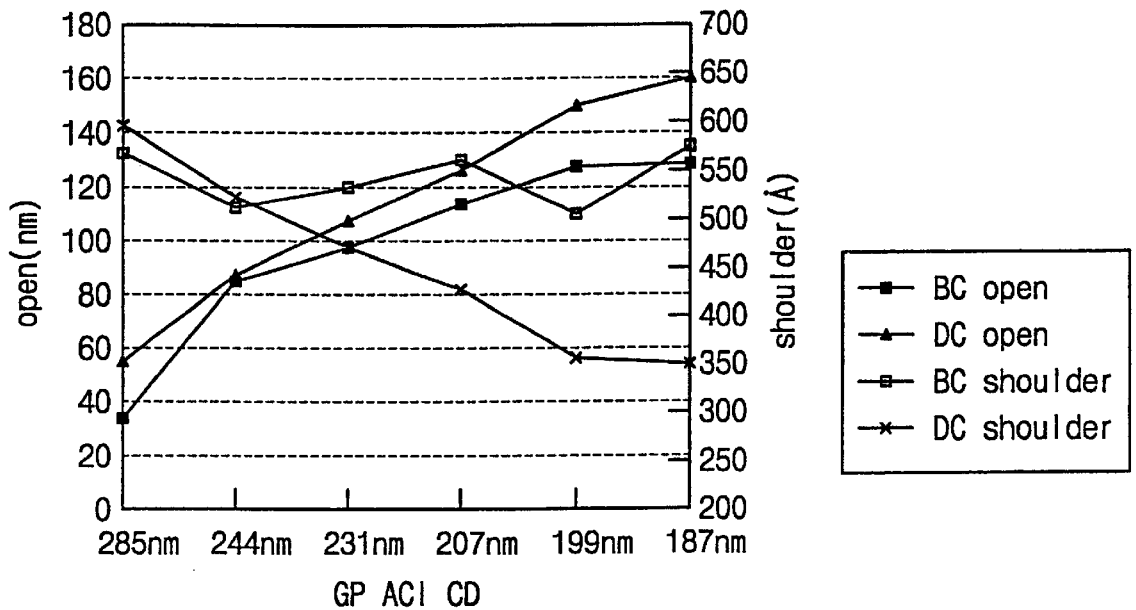
FIG. 2 schematically shows a graph illustrating the relationship between GP (gate poly) CD effect and DC shoulder and BC open.

In the present invention, the effect of a distance between adjacent gate lines on DC shoulder and BC opening is investigated and schematically shown in FIG. 2. Herein, the term DC shoulder refers to the thinnest portion of the sidewall spacer exposed by the DC.

As shown in FIG. 2, DC shoulder significantly depends on the GP (gate poly) spacing (hereinafter refers to the distance between adjacent gate lines) in the DC forming region. Namely, the DC shoulder is inversely proportional to the GP spacing and its gradient is very large.

On the other hand, the BC shoulder is substantially independent of the GP spacing at the BC forming region. But, the BC opening is proportional to the GP spacing. Accordingly, in order to improve the formation of BC opening and to reinforce (increase) the DC shoulder, it is required that GP spacing in the BC forming region be increased and GP spacing in the DC forming region be decreased.

Figure 3:
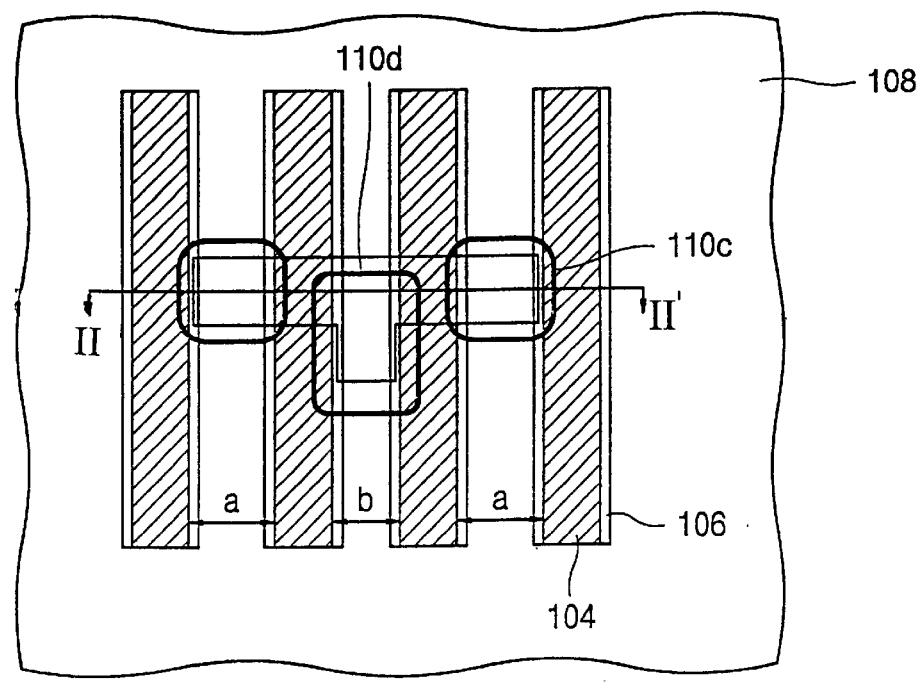
FIG. 3 is a top plan view showing gate lines and contacts according to the present invention.

FIG. 3 schematically shows a top plan view of a semiconductor substrate having gate lines and bit line according to the present invention. In FIG. 3, reference number 104 denotes a gate line, reference number 110c denotes a storage node contact (BC), reference number 110d denotes bit line contact (DC), reference number 106 denotes a nitride spacer, and reference number 108 denotes an insulating layer.

As illustrated in FIG. 3, a spacing between adjacent gate lines in the BC forming region (see reference number "a") is equal to or larger than a spacing between adjacent gate lines in the DC forming region (see reference number "b"). Also, the top dimension of BC 110c is smaller than the top dimension of DC 110d. Particularly, a spacing between adjacent gate lines in the BC forming region is about 0.1 to 0.4 microns and a spacing between adjacent gate lines in the DC forming region is about 0.05 to 0.3 microns. The DC top dimension is about 0.28 micron×0.5×0.48 micron×0.5 to 0.28 micron×1×0.48 micron×1 and the BC top dimension is about 0.28 micron×0.5×0.28 micron×0.5 to 0.28 micron×1× 0.28 micron×1.

Figure 4A:
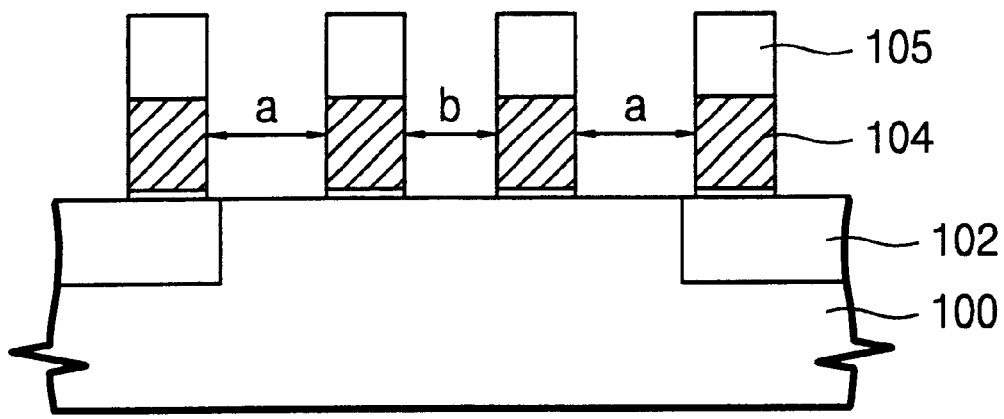
FIGS. 4A to 4E are cross-sectional views illustrating a method of forming self-aligned contacts according to a first embodiment of the present invention, taken along line II–II' of FIG. 3.
Figure 4B:
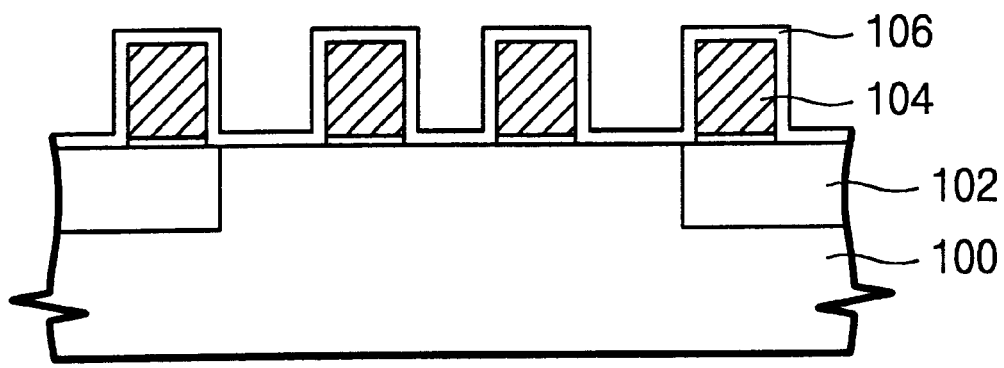
Figure 4C:
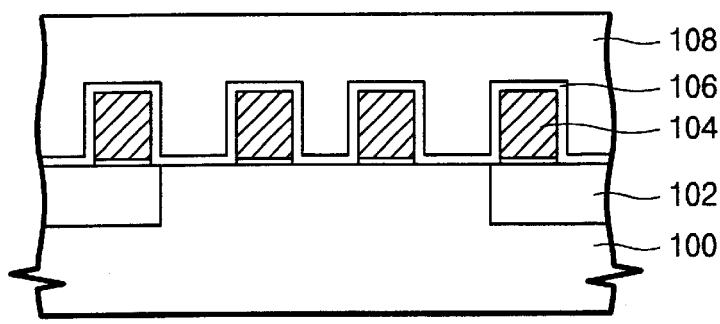
Figure 4D:
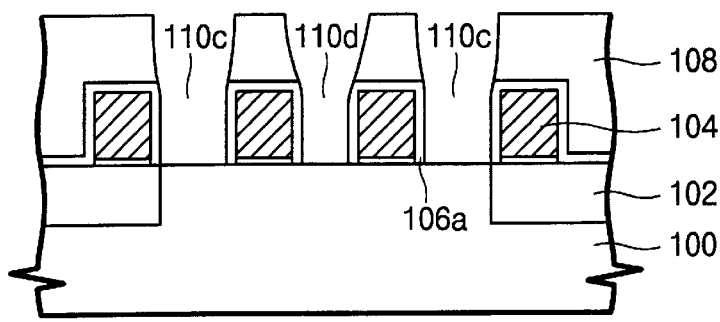
Figure 4E:
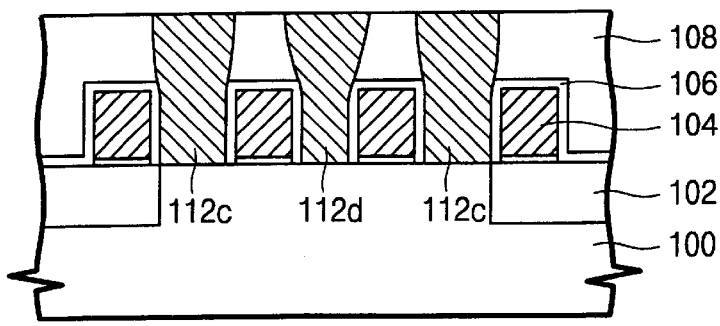
Figure 5A:
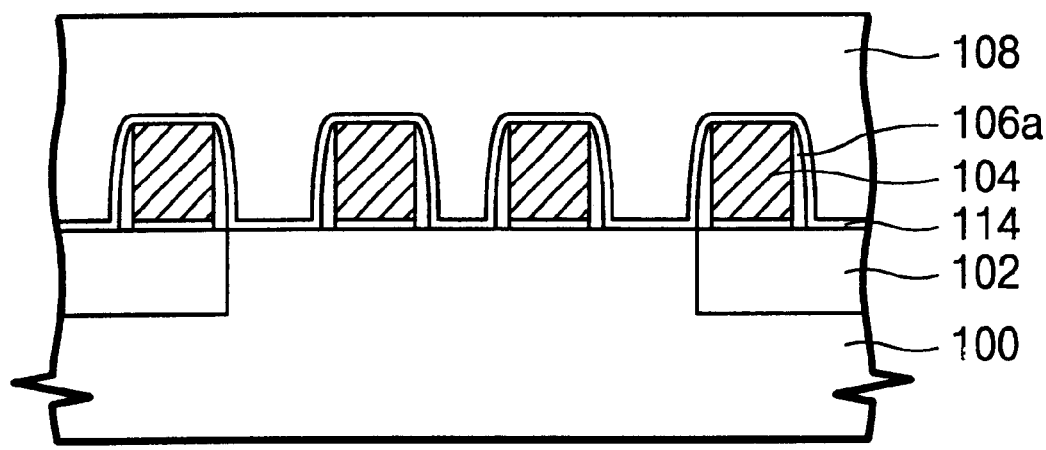
FIGS. 5A and 5B are cross-sectional views illustrating selected stages of a method of forming self-aligned contacts according to a second embodiment of the present invention, taken along line II–II' of FIG. 3.
Figure 5B:
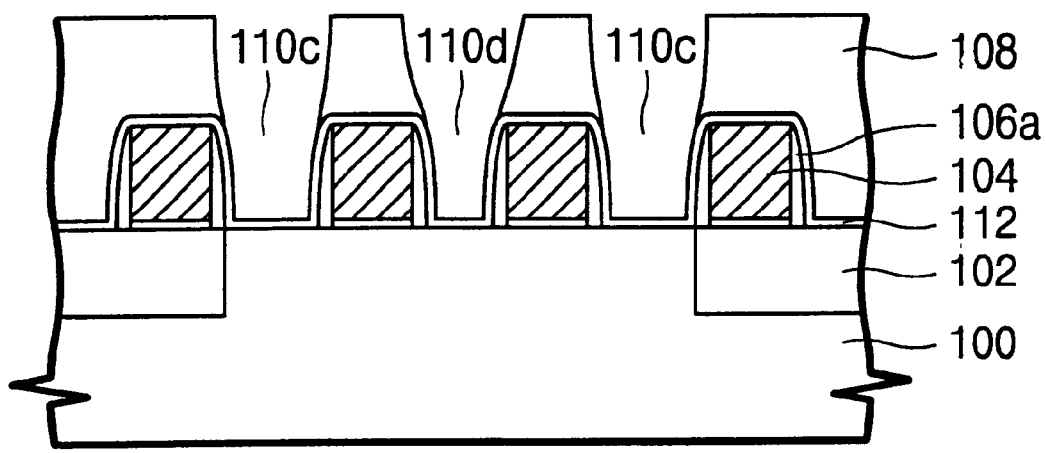

Methods of forming contact holes according to the present invention are illustrated in FIGS. 4A to 4E and FIGS. 5A and 5B. FIGS. 4A to 4E are cross-sectional views illustrating a method of forming self-aligned contacts according to a first embodiment of the present invention, taken along line II–II' of FIG. 3. FIGS. 5A and 5B are cross-sectional views illustrating selected stages of a method of forming self-aligned contact holes according to a second embodiment of the present invention, taken along line II–II' of FIG. 3.

FIG. 4A shows a cross-sectional view of a semiconductor substrate subject to semiconductor manufacturing processes in accordance with the present invention. First, a semiconductor substrate 100 is provided. Device isolation regions 102 are formed in the substrate 100 by conventional techniques, such as a shallow trench isolation (STI) technique. Other suitable techniques such as local oxidation of silicon (LOCOS) may also be adopted. The substrate 100 surrounded by device isolation regions 102 is defined as an active region to which electrical connection is to be made. A gate dielectric layer is grown on the substrate. A gate electrode conductive layer is formed on the gate dielectric layer. The gate electrode conductive layer is formed of a double layer structure of a polysilicon of about 1,000 angstroms and a metal silicide such as tungsten silicide of about 1,500 angstroms. A capping layer is then deposited on the gate electrode conductive layer. The capping layer (not shown) is formed of a double layer structure of a silicon nitride of about 1,000 to 3,000 angstroms and an oxide of about 1,500 angstroms.

A photoresist layer is then spin coated on the capping layer. The photoresist layer is exposed and patterned to form a photoresist pattern 105. Using the patterned photoresist pattern 105, underlying capping layer, the gate electrode conductive layer and the gate dielectric layer are etched to form gate lines 104. In the present invention, a spacing between adjacent gate lines "a" where a storage node contact is to be made is equal to or larger than a spacing between adjacent gate lines "b" where a bit line contact is to be made. Particularly, the spacing "a" is about 0.1 to 0.4 microns and the spacing "b" is about 0.05 to 0.3 microns.

Referring to FIG. 4B, a spacer forming nitride layer 106 is deposited overlying the gate lines 104. The spacer forming layer 106, formed of an insulating material such as nitride, is deposited to a thickness of about 100 to 1,000 angstroms by a conventional LPCVD (low-pressure chemical vapor deposition) technique.

Referring now to FIG. 4C, an oxide layer is subsequently deposited by a CVD technique to a thickness of about 9,500 angstroms. After that, planarizing processes such as CMP is carried out on the oxide layer to form a planarized oxide layer 108. For example, the CMP process etches about 3,000 angstroms oxide layer.

Next, using a photolithographic process, selected portions of the oxide layer 108 are etched to form self-aligned contact holes 110c and 110d, as shown in FIG. 4D. More particularly, oxide layer 108 is selectively etched with respect to the spacer forming nitride layer 106 and capping layer of the gate electrode. Then, the exposed spacer forming nitride layer between the gate electrodes is etched until the semiconductor substrate 100 is exposed, thereby forming a sidewall spacer together with the formation of the self-aligned storage node contact (BC) and 110c and bit line contact (DC) 110d.

At this time, BC 110c and DC 110d are formed such that the top dimension of the BC 100c is smaller than that of the DC 110d. For example, resulting DC top dimension is about 0.28 micron×0.5×0.48 micron×0.5 to 0.28 micron×1×0.48 micron×1, and the top dimension of the BC is about 0.28 micron×0.5×0.28 micron×0.5 to 0.28 micron×1×0.28 micron×1.

In the present invention, a spacing "a" where a storage node contact is to be made is larger than spacing "b" where a bit line contact is to be made unlike the gate line layout of prior art shown in FIG. 1A. Moreover, the top dimension of the bit line contact hole 110d is larger than that of the storage node contact hole 110c. Accordingly, the BC not-opening phenomenon and the DC shoulder over-etching phenomenon can be avoided.

Referring now to FIG. 4E, a conductive material such as a polysilicon is deposited in the contact holes 110c and 110d and planarized to form contact pads 112c and 112d for storage node contact and bit line contact, respectively. Planarization can be performed by etch-back or CMP.

Subsequently, bit lines, capacitors and interconnections are formed using conventional techniques.

FIGS. 5A and 5B schematically illustrates a second embodiment of the present invention. Significant difference from the first embodiment is that self-aligned contact holes are formed after the formation of sidewall spacers. In the first embodiment, the self-aligned contact holes are formed together with the formation of the sidewall spacers.

In FIG. 5, same parts functioning as shown in FIG. 4 are identified with the same reference numbers. As in FIGS. 4A and 4B, gate lines 104 are formed and then sidewall spacer forming layer 106, formed of an insulating material such as nitride, is deposited on the gate line 104. The sidewall forming layer 106 is etched to form sidewall spacers 106a on a sidewall of each gate line 104 as shown in FIG. 5A. Then, an optional second nitride layer 114 can be deposited on the resulting structure to a thickness of about 50 to 100 angstroms by LPCVD technique. The optional second nitride layer 114 can serve as an etching stopper layer in subsequent self-aligned contact etching process. Then an oxide layer 108 is deposited on the resulting structure. Self-aligned contact etching process is carried out to form self-aligned storage node contact 110c and bit line contact 110d. The next process sequences are identical to the first embodiment.

The present invention provides a method of forming self-aligned contacts for bit line and storage node. The contact holes are opened in the insulating layer down to the substrate between the gate lines. The gate lines are formed such that spaces between adjacent gate lines for BC is equal to or larger than that for DC in order to overcome "BC not-opening phenomenon" and "DC shoulder weakness or over-etch".

In the drawing and the specification, there have been disclosed typical preferred embodiments of the invention, and although specific terms are employed, they are used in a generic sense only and not for purpose of limitation, the scope of the invention being set forth in the following claims.

What is claimed is:

1. A self-aligned contact pad in a semiconductor substrate comprising:

a plurality of spaced apart gate lines formed on a semiconductor substrate;

an insulating layer formed overlying the gate lines; and a bit line contact and a storage node contact formed in the insulating layer to the substrate between the gate lines, wherein a spacing between the gate lines on which the bit line contact is formed is equal to or less than a spacing between the gate lines on which the storage node is formed.

2. The self-aligned contact according to claim 1, wherein the spacing between the gate lines on which a bit line contact is to be made is in the range of about 0.05 to 0.3 microns and the spacing between the gate lines on which a storage node contact is to be made is in the range of about 0.1 to 0.4 microns.

3. The self-aligned contact pad according to claim 1, wherein a top dimension of the bit line contact is larger than a top dimension of the storage node contact.

4. The self-aligned contact according to claim 3, wherein the top dimension of the storage node contact is in the range of about 0.28 micron×0.5×0.28 micron×0.5 to 0.28 micron×1×0.28 micron×1 and the top dimension of the bit line contact is in the range of about 0.28 micron×0.5×0.48 micron×0.5 to 0.28 micron×1×0.48 micron×1.

5. A self-aligned contact pad in a semiconductor substrate comprising:
   a plurality of spaced apart gate lines formed on a semiconductor substrate;
   an insulating layer formed overlying the gate lines; and
   a bit line contact and a storage node contact formed in the insulating layer to the substrate between the gate lines,
   wherein a spacing between the gate lines on which the bit line contact is formed is equal to a spacing between the adjacent gate lines on which the storage node is formed.

6. The self-aligned contact according to claim 5, wherein the spacing between the adjacent gate lines on which a bit line contact is to be made is in the range of about 0.05 to 0.3 microns and the spacing between the adjacent gate lines on which a storage node contact is to be made is in the range of about 0.1 to 0.4 microns.

7. The self-aligned contact pad according to claim 5, wherein a top dimension of the bit line contact is larger than a top dimension of the storage node contact.

8. The self-aligned contact according to claim 7, wherein the top dimension of the storage node contact is in the range of about 0.28 micron×0.5×0.28 micron×0.5 to 0.28 micron×1×0.28 micron×1 and the top dimension of the bit line contact is in the range of about 0.28 micron×0.5×0.48 micron×0.5 to 0.28 micron×1×0.48 micron×1.

9. A self-aligned contact pad in a semiconductor substrate comprising:
   a plurality of adjacent gate lines formed on a semiconductor substrate;
   an insulating layer formed overlying the adjacent gate lines; and
   a bit line contact and a storage node contact formed in the insulating layer to the substrate between the adjacent gate lines,
   wherein a spacing between the adjacent gate lines on which the bit line contact is formed is less than a spacing between the adjacent gate lines on which the storage node is formed.

10. The self-aligned contact according to claim 9, wherein in the spacing between the adjacent gate lines on which a bit line contact is to be made is in the range of about 0.05 to 0.3 microns and the spacing between the adjacent gate lines on which a storage node contact is to be made is in the range of about 0.1 to 0.4 microns.

11. The self-aligned contact pad according to claim 9, wherein a top dimension of the bit line contact is larger than a top dimension of the storage node contact.

12. The self-aligned contact according to claim 11, wherein the top dimension of the storage node contact is in the range of about 0.28 micron×0.5×0.28 micro×0.5 to 0.28 micron×1×0.28 micron×1 and the top dimension of the bit line contact is in the range of about 0.28 micron×0.5×0.48 micron×0.5 to 0.28 micron×1×0.48 micron×1.

13. The self-aligned contact according to claim 11, wherein the top dimension of the storage node contact is in the range of about 0.28 micron×0.5×0.28 micron×0.5 to 0.28 micron×1×0.28 micron×1 and the top dimension of the bit line contact is in the range of about 0.28 micron×0.5×0.48 micron×0.5 to 0.28 micron×1×0.48 micron×1.

14. The self-aligned contact according to claim 9, wherein the spacing between the adjacent gate lines on which a bit line contact is to be made is in the range of about 0.05 to 0.3 microns and the spacing between the adjacent gate lines on which a storage node contact is to be made is in the range of about 0.1 to 0.4 microns.

15. The self-aligned contact pad according to claim 9, wherein a top dimension of the bit line contact is substantially larger than a top dimension of the storage node contact.

16. A self-aligned contact pad in a semiconductor substrate comprising:
   a plurality of the adjacent gate lines formed on a semiconductor substrate;
   an insulating layer formed overlying the adjacent gate lines; and
   a bit line contact and a storage node contact formed in the insulating layer to the substrate between the adjacent gate lines,
   wherein a spacing between the adjacent gate lines on which the bit line contact is formed is substantially less than a spacing between the adjacent gate lines on which the storage node is formed.

* * * * *